United States Patent
Gupta

(10) Patent No.: US 8,681,918 B2
(45) Date of Patent: **\*Mar. 25, 2014**

(54) HIGH JITTER AND FREQUENCY DRIFT TOLERANT CLOCK DATA RECOVERY

(71) Applicant: STMicroelectronics International N.V., Amsterdam (NL)

(72) Inventor: Nitin Gupta, Greater Nodia (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/784,571

(22) Filed: Mar. 4, 2013

(65) Prior Publication Data

US 2013/0181754 A1 Jul. 18, 2013

Related U.S. Application Data

(63) Continuation of application No. 12/841,096, filed on Jul. 21, 2010, now Pat. No. 8,411,811.

(30) Foreign Application Priority Data

May 7, 2010 (IN) ............................ 1087/DEL/2010

(51) Int. Cl.
*H04L 7/00* (2006.01)

(52) U.S. Cl.
USPC .......................................... 375/375; 375/354

(58) Field of Classification Search
USPC ......... 375/354, 357, 369, 371, 372, 373, 374; 370/395.62, 507; 455/265; 713/375, 713/400
See application file for complete search history.

(56) References Cited

U.S. PATENT DOCUMENTS

| 4,672,639 A * | 6/1987 | Tanabe et al. ................. 375/371 |
| 7,436,882 B2 * | 10/2008 | Momtaz ........................ 375/233 |
| 8,149,038 B1 * | 4/2012 | Sung et al. .................... 327/231 |

OTHER PUBLICATIONS

Lee, Sang-Hyun et al., "A 5-Gb/s 0.25-μm CMOS Jitter-Tolerant Variable-Interval Oversampling Clock/Data Recovery Circuit", IEEE Journal of Solid-State Circuits, vol. 37, No. 12, Dec. 2002, pp. 1822-1830.

Musa, Faisal A. et al., "Clock Recovery in High-Speed Multilevel Serial Links", Dept. of Electrical and Computer Engineering, University of Toronto, IEEE Intl. Symp. Circuits & Systems, May 2003, pp. 1-4.

* cited by examiner

*Primary Examiner* — Sam K Ahn
*Assistant Examiner* — Janice Tieu
(74) *Attorney, Agent, or Firm* — Hogan Lovells US LLP

(57) ABSTRACT

In a method for recovery of a dock from a received digital data stream and an apparatus for recovering a clock from a received digital data stream, phase-shifted dock signals are generated from a receiver's dock. After selecting one of the phase-shifted clock signals, two other phase-shifted clock signals are determined. Depending on sample values taken at rising/falling edges of the three selected phase-shifted clock signals, counter values are increased and compared. The selection of phase-shifted clock signals and the steps of sampling the input digital data stream, comparing the values and increasing counter values, if required, are repeatedly performed until the comparison result of the counter values indicates that one of the latter determined phase-shifted clock signals strobes the received digital data stream in the center of a bit period.

22 Claims, 9 Drawing Sheets

HIGH JITTER AND FREQUENCY DRIFT TOLERANT CLOCK DATA RECOVERY

RELATED APPLICATION

The present invention is a continuation of U.S. patent application Ser. No. 12/841,096 filed Jul. 21, 2010, which claims the benefit of Indian Patent Application No. 1087/DEL/2010 filed May 7, 2010, both of which are incorporated herein by reference in their entireties.

FIELD OF THE INVENTION

The invention relates to the field of clock data recovery. In particular, the invention relates to a method for recovery of a clock from a received digital data stream and to an apparatus for performing the method for recovering a clock from a received digital data stream.

BACKGROUND OF THE RELATED ART

Due to the increased demand for quickly transferring growing amounts of data, there has been a rapid spread in transmission networks handling digital data in recent years. In such transmission networks, source information is coded at a source node in synchronization with a system clock and transmitted as digital data through the transmission network to a receiver node. The receiver node uses its receiver clock for decoding the received digital data to reproduce the original source information.

In a mesochronous transmission network (e.g., a High Definition Multimedia Interface, referred to as HDMI), the reference clocks for the transmitter and for the receiver operate at the same frequency, however do not have a phase relation. In order to correctly recover the data, the receiver must sample the data exactly at an incoming data eye.

In a plesiochronous transmission network (e.g., M-Phy or USB), the reference clocks for the transmitter and for the receiver operate at slightly different frequencies. Thus, in these networks, the requirement for placing a strobe at an incoming data eye of the received data further encompasses a correction of the frequency variation. Fulfilling these requirements is challenging in the light of reducing the needed hardware of such receiver devices.

Although the frequency of the clock signal may be coordinated between a transmitter and a receiver prior to the transmission of data, the received digital data signal may still show temporal variations in consecutive edges of the data signal, also referred to as jitter. Jitter, which may also be characterized as short-term variations of a signal with respect to its ideal position in time, may negatively impact data transmission quality. Jitter may be induced and coupled onto a clock signal from several different sources and is not uniform over all frequencies. In digital systems, jitter may also lead to a violation of timing margins, causing circuits to behave improperly.

Jitter may be caused by attenuation characteristics of a channel, cross talk, reflection or electromagnetic interference (EMI) from nearby devices and equipment, random thermal noise from a crystal, or due to the fact that crystals of the receiver's clock and transmitter's clock are slightly different in most cases.

That is, the clock recovery circuit needs to have a sufficient high-frequency jitter tolerance. If the these temporal variations in consecutive edges of the data signal are not compensated, errors will occur in determining the received data.

The transmission of data at high data rates increasingly depends on the performance of clock data recovery (CDR) that is used to recover the transmitted data signal from the received signal. High performance CDR methods are essential to accurately extract timing information from high-frequency signals and to recover the transmitted data signal from the received signal upon retrieving the correct clock from the received data stream.

In case of, for instance, the deviation of the frequency between a receiver clock and the transmitter clock of the data stream exceeding a certain threshold, data may be lost due to the correct detection of the data bits being impossible.

Several techniques have been proposed that provide clock data recovery, even in case of jitter. One known technique is over-sampling clock data recovery (CDR), which over-samples the incoming digital data and chooses which sample of the over-sampled data best represents the data. In particular, a bit of the incoming data stream is sampled at plural strobes. Then, the strobes at the transition points of the bit determine the edge(s) of the bit. Based on the strobes at the edge(s) of the bit, the middle strobe, which represents the clock, is determined by selecting the strobe being farthest from the edge(s). However, employing this technique leads to an increase in hardware and current consumption due to more numbers of samples being required for finding the edge(s) of a bit, in case the jitter increases.

According to a further drawback of this technique, in case of frequency drift between transmitter clock and receiver clock, an extra elasticity buffer is required for preventing data loss, wherein the elasticity buffer is proportional to the maximum data processed at a time.

A different approach relating to clock data recovery is known as the Bang-Bang Phase Detector based CDR. For each data bit, samples are taken by phase-shifted clock signals. It is sensed whether an input data edge is before or after a corresponding clock edge, and then a positive or negative pulse is output, respectively. In cases of no data transition being close to a clock edge, the phase detector maintains an output of zero. Further, the Bang-Bang Phase Detector merely distinguishes the sign of a phase error, however not its magnitude.

As a further drawback of known CDR techniques, more than three strobes are required for sampling the eye-opening. Accordingly, this results in the requirement of an increased number of clock phases, wherein the increased number of needed strobes is unsuitable for high performance CDR applications in high speed networks.

Another example of a circuit for clock data recovery is disclosed in H. Lee, et al, "A 5 Gb/s 0.25 µm CMOS Jitter-Tolerant Variable-Interval Oversampling Clock/Data Recovery Circuit", IEEE Journal of Solid-State Circuits; Vol. 37; No. 12; December 2002. Therein, a clock/data recovery circuit incorporating a variable-interval 3x-oversampling method is described for enhanced high-frequency jitter tolerance. The CDR circuit traces the eye-opening region to place the data-sampling clock exactly at the center of a data eye, responding to the shape and magnitude of jitter. Each data bit is sampled by three strobes. After analyzing these samples, the PLL frequency is adapted. The CDR operates at a data rate of 5 Gb/s and shows a bit error rate of less than 10-13 when the magnitude of data jitter reaches 60.5% of a bit time. However, the lock time of the circuit is very high and any frequency drift will result in a repeatedly performed adaptation of the PLL frequency. Furthermore, there may also be a limitation of the PLL track bandwidth.

However, the aforementioned proposed techniques could not provide a satisfactory method and apparatus for clock recovery in high speed networks in case of the occurrence of high frequency jitter and high frequency drift.

Given these problems with the existing technology, it would be advantageous to provide an improved method which allows recovering the clock of a received data stream, even in case of high jitter and high frequency drift. Moreover, it would be advantageous to provide an improved apparatus being capable of performing the method for recovery of a clock from a received digital data stream.

SUMMARY

In an embodiment, the present invention employs a receiver's clock and generates plural phase-shifted clock signals from the receiver's clock. After selecting one of the phase-shifted clock signals, two other phase-shifted clock signals are determined. Dependent on sample values taken at rising/falling edges of the three selected phase-shifted clock signals, counter values are increased and compared. The selection of phase-shifted clock signals and the steps of sampling the input digital data stream, comparing the values and increasing counter values, if required, are repeatedly performed until the comparison result of the counter values indicates that one of the latter determined phase-shifted clock signals strobes the received digital data stream in the centre of a bit period.

According to a first aspect of the invention, a method for recovery of a clock from a received digital data stream is provided. The method comprises plural steps. As a first step, N phase-shifted clock signals are generated, wherein the phase of each clock signal is consecutively increased by $2\pi/N$ on the basis of the phase of the preceding clock signal. Then, one of the N phase-shifted clock signals is determined as a clock signal M. Subsequently, another one of the N phase-shifted clock signals is determined as a clock signal R, wherein the phase of the clock signal R differs from the phase of the clock signal M by a first predetermined phase-shift. Next, another one of the N phase-shifted clock signals is determined as a clock signal L, wherein the phase of the clock signal L differs from the phase of the clock signal M by a second predetermined phase-shift. Then, a rising/falling edge of the clock signal M is selected. Then, in the clock signal R a rising/falling edge is selected that is nearest in the positive time direction to the selected rising/falling edge of the clock signal M. Subsequently, in the clock signal L a rising/falling edge is selected that is nearest in the negative time direction to the selected rising/falling edge of the clock signal M. As a next step, an l-value, an m-value and an r-value is determined by respectively sampling the received digital data stream at the selected rising/falling edges of the clock signals L, M, and R. Then, a counter value LC is increased by a predetermined amount, if the l-value differs from the m-value. If the r-value differs from the m-value, a counter value RC is increased by the predetermined amount.

If the counter value LC is greater than the counter value RC, one of the N phase-shifted clock signals which has a phase that differs from the phase of the clock signal M by $2\pi/N$ is selected and the selected signal is defined as the clock signal M.

If the counter value RC is greater than the counter value LC, one of the N phase-shifted clock signals which has a phase that differs from the phase of the clock signal M by $-2\pi/N$ is selected and the selected signal is defined as the clock signal M.

In one embodiment of the invention, the counter value LC and the counter value RC may be reset to an initial value after having selected the rising/falling edges in the clock signals M, R and L.

In another embodiment of the invention, the digital data stream may comprise plural bits each at a bit period.

According to a further embodiment of the invention, the cycle duration of the N phase-shifted clock signals may be substantially equal to the bit period of the received digital data stream.

In a still further embodiment of the invention, the determination of an l-value, an m-value and an r-value by respectively sampling the received digital data stream at the selected rising/falling edges of the clock signals L, M, and R; the increase of a counter value LC by a predetermined amount, if the l-value differs from the m-value; and the increase of a counter value RC by the predetermined amount, if the r-value differs from the m-value may repeatedly be performed for a number of x successional bits.

In another embodiment of the invention, after having initially performed the plural method steps according to the first aspect of the invention, the plural steps according to the first aspect except the first step thereof may repeatedly be performed until the counter value RC is equal to the counter value LC.

In a further embodiment of the invention, the selected clock signal M may relate to the recovered clock, if the counter value RC is equal to the counter value LC.

According to another embodiment of the invention, the first predetermined phase-shift may be defined as the maximum forward phase-shift between a rising/falling edge of one of the N phase-shifted clock signals and a rising/falling edge of the clock signal M within a relative forward phase-shift range less than Tr.

In still a further embodiment of the invention, the second predetermined phase-shift may be defined as the maximum backwards phase-shift between a rising/falling edge of one of the N phase-shifted clock signals and a rising/falling edge of the clock signal M within a relative backwards phase-shift range less than Tr.

In another embodiment of the invention, the predetermined amount for increasing the counter value RC and/or the counter value LC may be 1.

According to another embodiment of the invention, the determined m-value and the determined clock signal M may be transmitted to a digital system after having determined the l-value, the m-value and the r-value.

In a further embodiment of the invention, the clock signal M may be maintained and all steps of the first aspect except the first and second steps thereof may be performed, if the counter value RC is equal to the counter value LC.

In another embodiment of the invention, all steps of the first aspect except the first and second steps thereof may be performed, after having selected one of the N phase-shifted clock signals which has a phase that differs from the phase of the clock signal M by $2\pi/N$ and after having defined the selected signal as the clock signal M, in case the counter value LC is greater than the counter value RC, or after having selected one of the N phase-shifted clock signals which has a phase that differs from the phase of the clock signal M by $-2\pi/N$ and after having defined the selected signal as the clock signal M, in case the counter value RC is greater than the counter value LC.

In another embodiment of the invention, N is an odd number.

According to a second aspect, the invention provides an apparatus for recovery of a clock from a received digital data stream. The apparatus comprises a phase-shifted clock signal generator for generating N phase-shifted clock signals, wherein the phase of each clock signal is consecutively increased by 2π/N on the basis of the phase of the preceding clock signal. The apparatus further comprises a phase selector, which is adapted to determine one of the N phase-shifted clock signals as a clock signal M. The phase selector is further adapted to determine another one of the N phase-shifted clock signals as a clock signal R, wherein the phase of the clock signal R differs from the phase of the clock signal M by a first predetermined phase-shift.

The phase selector is further adapted to determine another one of the N phase-shifted clock signals as a clock signal L, wherein the phase of the clock signal L differs from the phase of the clock signal M by a second predetermined phase-shift. Additionally, the apparatus comprises a sampling circuit that is adapted to select a rising/falling edge of the clock signal M; to select in the clock signal R a rising/falling edge that is nearest in the positive time direction to the selected rising/falling edge of the clock signal M; to select in the clock signal L a rising/falling edge that is nearest in the negative time direction to the selected rising/falling edge of the clock signal M; and to determine an l-value, an m-value and an r-value by respectively sampling the received digital data stream at the selected rising/falling edges of the clock signals L, M, and R.

Moreover, the apparatus comprises a left counter for increasing a counter value LC by a predetermined amount, if it has been determined by a left comparator that the l-value differs from the m-value; and a right counter for increasing a counter value RC by the predetermined amount, if it has been determined by a right comparator that the r-value differs from the m-value.

The apparatus further comprises a phase selector which is adapted to select one of the N phase-shifted clock signals which has a phase that differs from the phase of the clock signal M by 2π/N and defining the selected signal as the clock signal M, if a counter value comparator has determined that the counter value LC is greater than the counter value RC; wherein the phase selector is further adapted to select one of the N phase-shifted clock signals which has a phase that differs from the phase of the clock signal M by −2π/N and defining the selected signal as the clock signal M, if the counter value comparator has determined that the counter value RC is greater than the counter value LC.

According to a further embodiment of the invention, the digital data stream may comprise plural bits each at a bit period.

In another embodiment of the invention, the cycle duration of the N phase-shifted clock signals may substantially be equal to the bit period of the received digital data stream.

In still a further embodiment of the invention, the selected clock signal M may relate to the recovered clock, if the counter value comparator has determined that the counter value RC is equal to the counter value LC.

According to a further embodiment of the invention, the first predetermined phase-shift may be defined as the maximum forward phase-shift between a rising/falling edge of one of the N phase-shifted clock signals and a rising/falling edge of the clock signal M within a relative forward phase-shift range less than π.

In another embodiment of the invention, the second predetermined phase-shift may be defined as the maximum backwards phase-shift between a rising/falling edge of one of the N phase-shifted clock signals and a rising/falling edge of the clock signal M within a relative backwards phase-shift range less than π.

According to a further embodiment of the invention, the apparatus further comprises a transmitting circuit for transmitting the determined m-value and the determined clock signal M to a digital system.

In another embodiment of the invention, N is an odd number.

BRIEF DESCRIPTION OF THE DRAWINGS

The accompanying drawings are incorporated into and form a part of the specification to illustrate several embodiments of the present invention. These drawings together with the description serve to explain the principles of the invention. The drawings are only for the purpose of illustrating preferred and alternative examples of how the invention can be made and used and are not to be construed as limiting the invention to only the illustrated and described embodiments. Further features and advantages will become apparent from the following and more particular from the description of the various embodiments of the invention as illustrated in the accompanying drawings, in which like reference numbers refer to like elements, and wherein.

DETAILED DESCRIPTION OF PREFERRED EMBODIMENTS

Figure 1:
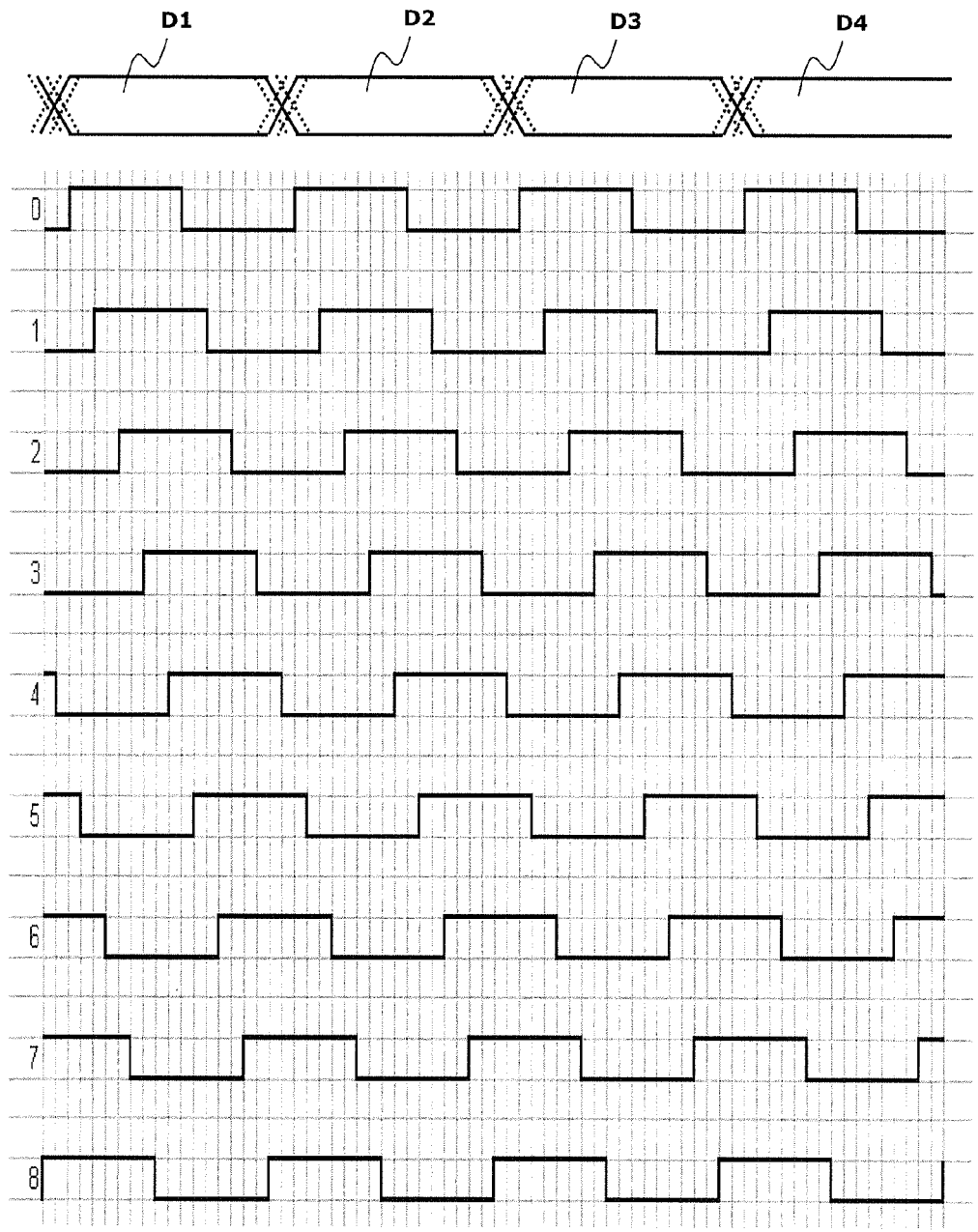
FIG. 1 shows a received data stream and plural phase-shifted clock signals according to an embodiment of the invention.

With reference to the drawings, FIG. 1 shows a received data stream and plural phase-shifted clock signals according to an embodiment of the invention. In particular, a data signal is shown that may be received by a receiver and that comprises an arbitrary bit sequence. D1, D2, D3 and D4 exemplary denote four bits each at a single bit period of a received digital data stream. Thereby, bit transitions are shown from LOW potential ("0") to HIGH potential ("1") and vice versa. The transitions between the logical states of the respective bits are indicated by the inclined continuous lines. Thereby, the inclined continuous lines represent an ideal edge location.

Generally, prior to data transmission, the data rate of such signal may be determined between transmitter and receiver according to a standard frequency specification. For instance, according to the Display Port 1.1a, the data rate may be 1.62 Gbps (low bit rate) or 2.7 Gbps (high bit rate). But as the crystals of the receiver and transmitter clocks are slightly different in many cases, there may also be some difference in frequency of the received data stream. Normally, the maximum allowed degree of jitter is also specified in the standards in terms of "ppm". As an example, for Display Port 1.1a, the maximum deviation of the frequency may be 300 ppm (0.03%), which means that there can be 486 KHz difference between the frequency of the transmitter and the receiver (e.g. for a data rate of 1.62 Gbps).

Consequently, dependent on the degree of jitter, the transition from LOW potential to HIGH potential or vice versa may occur before or after the point in time of the transition as indicated by the inclined continuous lines. Consequently, the resulting jitter of the signal may lead to a shift of the point in time the transition between the logical signals. With respect to these cases, the transitions are exemplary illustrated by the dotted lines. The dotted lines thus represent a short-term variation of the ideal edge position of the signal. This frequency drift is targeted by the proposed method in order to provide a reliable clock data recovery. The various possible positions of one particular transition within the data stream at which jitter occurs (indicated by the dotted lines) is also referred to as "jittery area".

Regarding the exemplary data stream illustrated in FIG. 1, ideal eye-openings are shown for the respective bits. Depending on the various standards (e.g. HDMI, USB, M-PHY, etc.), the eye-opening of the reception signal's width and height may differ. In order to correctly detect the clock from the received digital data stream, it is aimed at precisely strobing the data bits at the center of the respective eye, even in case of high frequency jitter.

To achieve this aim, the method according to an embodiment of the invention employs a plurality of phase-shifted clock signals generated from the receiver's clock signal. Generally, N phase-shifted clock signals are generated with equal phase-shifts. As already mentioned, the clock of the receiver and the clock inherent in the received data stream have a maximum allowed deviation to each other. As this deviation varies on a small scale only (in the exemplarily above-mentioned standard only 0.03%), the period of one bit of the data stream and the cycle duration of one of the phase-shifted clock signals are substantially the same. As can be seen from FIG. 1, the period of one of bits D1 to D4 is almost identical to one of the phase-shifted clock signals 0 to 8. It should be further noted that in case of having different crystal frequencies at the transmitter and receiver sides, the average frequency considered over a certain period of time is still the same.

According to an embodiment of the invention, N is an odd number. The phase of each clock signal is consecutively increased by $2\pi/N$ ($360°/N$) on the basis of the phase of the preceding clock signal. In other words, N phase-shifted clock signals are generated, wherein for each clock signal a phase shift of $2\pi/N$ is added to the phase of the preceding clock signal. If, for instance, starting with a first clock signal $x_0$, a phase-shifted clock signal $x_1$ may have a phase difference to signal $x_0$, which is calculated by: $x_i = i*2\pi/N$. These phase-shifted clock signals may, for instance, be generated by a PLL or DLL circuit.

In an exemplary embodiment as illustrated in FIG. 1, nine phase-shifted clock signals are provided (phase-shifted clock signals no. 0 to 8), each differing from the preceding clock signal by a phase-shift of 40° (360°/9). It should be mentioned that the number N may be equal to the minimum required number of phase-shifted clock signals needed for detecting the center strobe of the eye of a received data bit, wherein each phase-shifted clock signal is capable of triggering a strobe at a different point in time. With reference to FIG. 1, nine equidistant phase-shifted clock signals are shown that provide strobes at 9 different points in time.

As can further be seen from the example shown in FIG. 1, the phase-shifted clock signal no. 4 would be the signal strobing the received data signal exactly in the middle of the eye-opening, if sampled at the rising edges of the clock signal.

Figure 2:
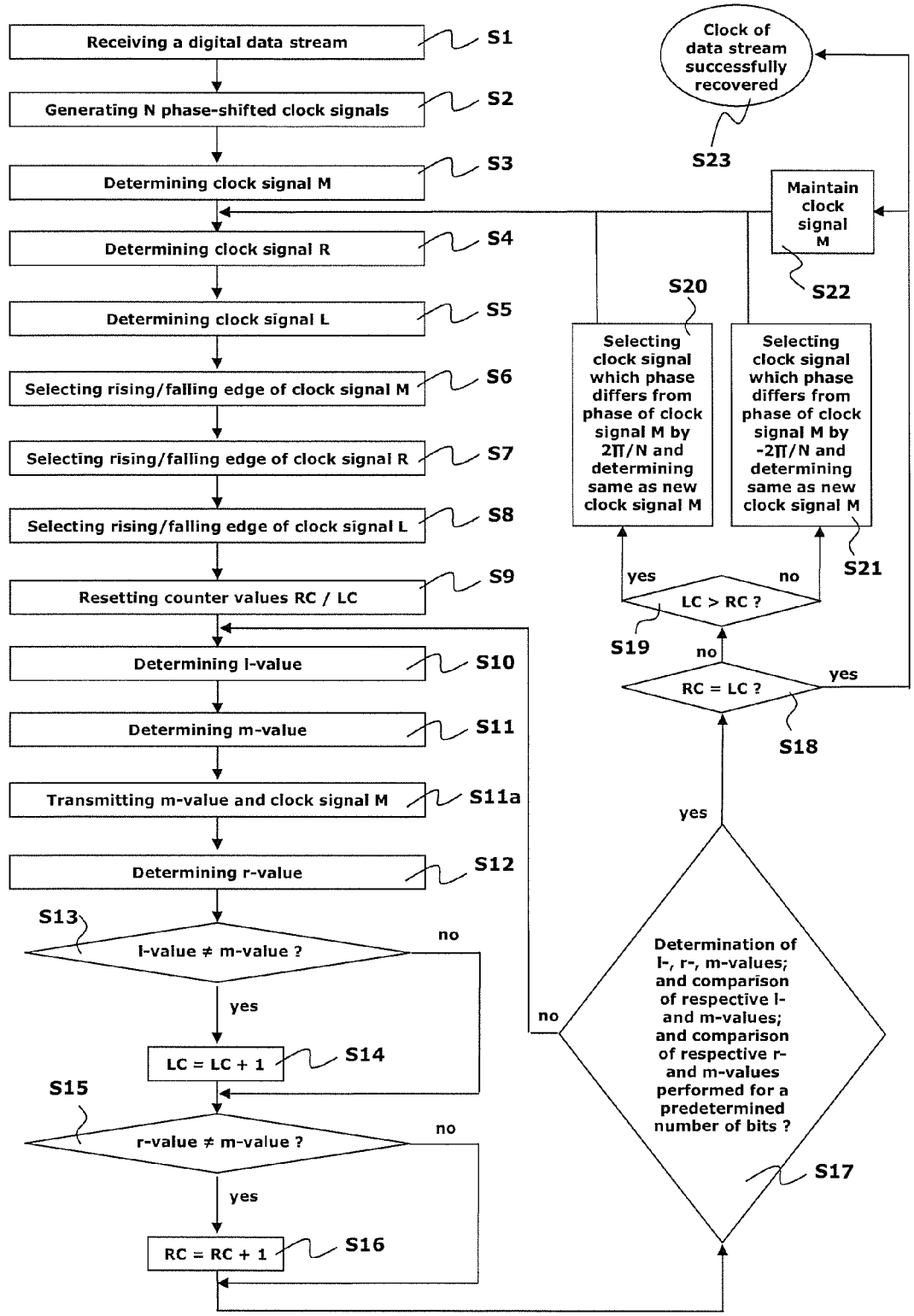
FIG. 2 illustrates a flow chart with the steps for recovering the clock of an input data stream according to an embodiment of the invention.

FIG. 2 illustrates a flow chart with method steps for recovering the clock of an input data stream according to an embodiment of the invention.

Generally, it should be noted that the expression "rising/falling edges" as used in the description involves that either the rising edges or the falling edges are considered in order to, for instance, determining phase-shifts. In other words, either all calculations are based on the rising edges of the signals or all calculations are based on the falling edges of the signals.

First, in step S1, the digital data stream is received by a receiver. In step S2, N phase-shifted clock signals may be generated as already described in connection with FIG. 1. However, as a variation of this embodiment of the invention, the N phase-shifted clock signals may already be generated prior to the reception of the data stream.

Subsequently, according to step S3, one of the N phase-shifted clock signals is selected and determined as a clock signal M. The initially determined clock signal M may be arbitrarily selected amongst all N phase-shifted clock signals. The determined phase-shifted clock signal M is also referred to as "middle strobe".

Next, in step S4, another one of the N phase-shifted clock signals is determined as a clock signal R. In particular, in order to find the clock signal R, at first the clock signal M is taken as reference. On the basis of rising/falling edges of the phase-shifted clock signals, the one of the plurality of phase-shifted clock signals is determined as the clock signal R, which has the maximum phase-shift within a range/offset of $\pi$ from the rising edge of the clock signal M. Thereby, the range/offset of $\pi$ is considered in the positive phase direction. As an example, it is referred to FIG. 1, wherein the phases of the phase-shifted clock signals 0 to 9 are phase-shifted in the positive direction starting from phase-shifted clock signal 0. For instance, phase-shifted clock signal 6 is positively phase shifted in comparison to phase-shifted clock signal 5.

Alternatively, the maximum positive phase-shift can also be computed by using the formula $(N-1)\pi/N$. If applying the formula to for instance the signals illustrated in FIG. 1, the maximum positive phase-shift (for N=9) is $8\pi/9$.

According to another embodiment of the invention, if having N different phase-shifted clock signals, the clock signal R may also be determined by employing the formula:

$$\text{Number}_{of\ phase\text{-}shifted\ clock\ signal\ to\ be\ determined\ as\ clock\ signal\ R} = (\text{Number}_{of\ phase\text{-}shifted\ clock\ signal\ determined\ as\ clock\ signal\ M} + (N-1)/2) \bmod N$$

With reference to the exemplary illustrated phase-shifted clock signals 0 to 9 of FIG. 1, e.g. phase-shifted clock signal 4 is chosen as clock signal M. Hence, according to the aforementioned formula, phase-shifted clock signal 8 is determined as the clock signal R.

Thus, it becomes evident from the example that the phase-shifted clock signal 8, which is the clock signal R has the maximum positive phase shift when employing phase-shifted clock signal 4 as clock signal M. In this regard, the phase of phase-shifted clock signal 8 may also be characterized as most leading or forward shifted phase relating to phase-shifted clock signal 4, if considered a relative positive phase range or offset of π.

The determined phase-shifted clock signal R is also referred to as "right strobe".

Then, in step S5, another one of the N phase-shifted clock signals is determined as a clock signal L. In particular, in order to find the clock signal L, again the clock signal M is taken as reference. On the basis of rising/falling edges of the phase-shifted clock signals, the one of the plurality of phase-shifted clock signals is determined as the clock signal L, which has the maximum phase-shift within a range/offset of −π from the rising edge of the clock signal M. Thereby, the range/offset of −π is considered in the negative phase direction. As an example, it is referred to FIG. 1, wherein the phases of the phase-shifted clock signals 0 to 9 are phase-shifted in the positive direction starting from phase-shifted clock signal 0. For instance, phase-shifted clock signal 6 is negatively phase shifted in comparison to phase-shifted clock signal 7.

Alternatively, the maximum negative phase-shift can also be computed by using the formula $-(N-1)\pi/N$. If applying the formula to for instance the signals illustrated in FIG. 1, the maximum negative phase-shift (for N=9) is $-8\pi/9$.

According to another embodiment of the invention, if having N different phase-shifted clock signals, the clock signal L may also be determined by employing the formula:

$$\text{Number}_{of\,phase\text{-}shifted\,clock\,signal\,to\,be\,determined\,as\,clock\,signal\,L} = (\text{Number}_{of\,phase\text{-}shifted\,clock\,signal\,determined\,as\,clock\,signal\,M} + (N-1)/2 + 1) \bmod N$$

With reference to the exemplary illustrated phase-shifted clock signals 0 to 9 of FIG. 1, e.g. phase-shifted clock signal 4 is chosen as clock signal M. Hence, according to the aforementioned formula, phase-shifted clock signal 0 is clock signal L.

Thus, it becomes evident from the example that the phase-shifted clock signal 0, which is the clock signal L has the maximum negative phase shift when employing phase-shifted clock signal 4 as clock signal M. In this regard, the phase of phase-shifted clock signal 0 may also be characterized as most lagging or backwards shifted phase relating to phase-shifted clock signal 4, if considered a relative negative phase range or offset of −π.

The determined phase-shifted clock signal L is also referred to as "left strobe".

According to step S6, a rising/falling edge of the clock signal M is selected. That is, a trigger is set to trigger at the periodically occurring rising/falling edges of clock signal M. Then, in step S7, in the clock signal R, a rising/falling edge is selected. That is, a trigger is set to trigger at the periodically occurring rising/falling edges of clock signal R. In step S8, in the clock signal L, a rising/falling edge is selected. That is, a trigger is set to trigger at the periodically occurring rising/falling edges of clock signal L.

Then, in step S9, a right counter that provides a right counter value RC is initialized to a value of zero. Accordingly, a left counter that provides a left counter value LC is initialized to a value of zero.

In the following step S10, an l-value is determined by sampling the received digital data stream at the selected rising/falling edge of the clock signal L. That is, the clock signal L triggers at the rising/falling edges and creates a sampled value (l-value). In other words, the left strobe strobes the data stream at the point in time of an rising/falling edge of clock signal L.

In the following step S11, an m-value is determined by sampling the received digital data stream at the selected rising/falling edge of the clock signal M. That is, the clock signal M triggers at the rising/falling edges and creates a sampled value (m-value). In other words, the middle strobe strobes the data stream at the point in time of an rising/falling edge of clock signal M.

In step S11a, the determined m-value is transmitted to a digital system such as a System on Chip (SoC) for further processing together with the selected clock signal M. In case of the selected clock signal M already strobing the bits of the continuous input data stream at the center (in case of a recovered clock), the determined m-value denotes a value at the ideal sampling point, to be further used as a recovered data.

In the following step S12, an r-value is determined by sampling the received digital data stream at the selected rising/falling edge of the clock signal R. That is, the clock signal R triggers at the rising/falling edges and creates a sampled value (r-value). In other words, the right strobe strobes the data stream at the point in time of an rising/falling edge of clock signal R.

The three samples (l-value, m-value and r-value) are to be taken such that the sampling points caused by the three corresponding clock signals L, M and R are next to each other with regard to the timing of sampling.

That is, the sampling point caused by the clock signal L is at the rising/falling edge nearest to a particular rising/falling edge of the clock signal M in the negative direction of time (if the sampling caused by the rising/falling edge of the clock signal M is considered as zero point on a scale of time). Thereby, the sampling point caused by the rising/falling edge of the clock signal L is prior to the sampling point caused by the rising/falling edge of the clock signal M.

Accordingly, the sampling point caused by the clock signal R is at the rising/falling edge nearest to a particular rising/falling edge of the clock signal M in the positive direction of time (if the sampling caused by the rising/falling edge of the clock signal M is considered as zero point on a scale of time). Thereby, the sampling point caused by the rising/falling edge of the clock signal R is past to the sampling point caused by the rising/falling edge of the clock signal M.

Upon having determined/sampled the respective values (l-value, m-value and r-value), it is determined in step S13 by a comparator, such as for instance an XOR gate, whether the l-value differs from the m-value. In case of a difference, it is proceeded with incrementing the counter value LC in step S14. That is, the counter value LC is calculated by: LC=LC+1. It is to be noted that the counter value LC may also be increased by any predetermined value. Otherwise, if no difference could be detected between the l-value and the m-value, the counter value LC remains the same and it is proceeded with step S15. Step S15 is also performed after having performed step S14.

According to step S15, it is determined by a comparator, such as for instance an XOR gate, whether the r-value differs from the m-value. In case of a difference, it is proceeded with incrementing the counter value RC in step S16. That is, the counter value RC is calculated by: RC=RC+1. It is to be noted that the counter value RC may also be increased by any predetermined value, which however is to be the same predetermined value used for incrementing the counter value LC. Otherwise, if no difference could be detected between the r-value and the m-value, counter value RC remains the same and it is proceeded with step S17. Step S17 is also performed after having performed step S16.

It should be noted that in case no bit transition occurring in the data stream, the left counter value LC and the right counter value RC will remain at zero. In this case, a correct identification of the clock would be difficult. Therefore, various standards prescribe at least one bit transition every x bits. E.g. the Display Port 1.1a standard prescribes at least one bit transition every 5 bits. According to this example, 10 bits should be sampled, if at least two bit transitions are desired.

As a variation of the embodiment of the invention, steps S10 to S16 may be repeatedly performed several times. The number of repetitions may be determined by, for instance, considering the jitter versus frequency tolerance curve or frequency ppm difference limitation.

Consequently, although the steps S10 to S16 may only performed once in this embodiment of the invention, the repetition of these steps (sampling and comparing) may be performed for a predetermined number of successional data bits, according to another embodiment of the invention.

In step S17, it is decided as to whether the process of determination of an l-value, m-value, r-value and the comparison of the respective l-value with the m-value and the comparison of the respective r-value with the m-value has been performed for a predetermined number of bits. If not, it is proceeded with step S10 until a predetermined number of successive bits samples have been taken and compared together with the potentially increasing of the respective counter values. If the steps S10 to S16 have already been processed for a predetermined number of successive data bits, it is decided to proceed with step S18.

In step S18, the counter value RC is compared to the counter value LC by a comparator. If the counter value RC is equal to the counter value LC, it is proceeded with step S23 and decided that the middle strobe respectively the clock signal M allows the sampling of the data bits at the middle of the eye. Thus, if both counter values are identical, it is indicated that the clock of the data stream is successfully recovered. It should be noted that "successfully recovered" is to be understood that the middle of a data bit is statistically sampled at the middle for a predetermined number of successional bits. In other words, the middle strobe statistically samples a respective data bit in the center of the eye. Thereby, dependent on the data rate and the number of phase-shifted clock signals N to be considered for finding the phase-shifted clock signal that allows sampling at the middle of a data bit, the found "center strobe" (if the counter values are equal) may still slightly differ from the absolute center of a data bit.

Simultaneously, if it is decided in step S18 that the counter value RC is equal to the counter value LC, it also proceeded with step S22, wherein the currently selected clock signal M is set as new clock signal M. After having performed step S22, it is proceeded with step S4. Such implementation allows to establish a loop, wherein it is continuously verified on the continuous input data stream whether clock signal M still is the recovered clock signal. For instance, once the clock signal is recovered by finding the correct clock signal M, due to frequency drift or change of external conditions like voltage, temperature or the like, the determination of the middle strobe has to be adapted.

However, if it is decided in step S18 that the counter values are not equal, it is proceeded with step S19, wherein it is assessed whether the counter value LC is greater than the counter value RC. If so, it is proceeded with step S20. In this case, according to which the counter value LC is greater than the counter value RC, it is indicated that the actual selected clock signal M statistically samples the data bit at the left side of the bit/eye. Hence, the center sampling of the data bit should be moved towards the right side. This is then accomplished by selecting another one of the phase-shifted clock signals N as clock signal M in step S20. In detail, the next selected clock signal M (new clock signal M) is the one of the phase-shifted clock signals N that has a positive phase-shift of $2\pi/N$. In other words, new clock signal M is determined by increasing the number of the phase-shifted clock signal previously selected as the clock signal M by a predetermined amount (may also be more than 1). Exemplarily, the new clock signal M may be determined by:

$$\text{Number}_{\text{of phase-shifted clock signal to be determined as new clock signal } M} = (\text{Number}_{\text{of phase-shifted clock signal previously determined as clock signal } M} + 1) \bmod N.$$

If, for instance, considering the aforementioned example, wherein the phase-shifted clock signal 4 was initially selected as the clock signal M, the new clock signal M would be the phase-shifted clock signal 5 after performing step S20. After having selected new clock signal M in step S20, it is proceeded with step S4 again and the assessment as to whether the new selected clock signal M represents the "middle strobe" that samples a bit of the data stream at the center of the eye opening is started again. Accordingly, the aforementioned steps are repeatedly performed. For exemplary purposes, it should be mentioned that after increasing the number of the phase-shifted clock signal to be the new clock signal M, also the clock signals R and L are adjusted according to the above mentioned algorithm.

Although in the subsequent step S4, the new clock signal R is determined by the calculation as described for the initially performed step S4 above, the determination of the new clock signal R upon having performed step S20 may also be expressed by basing on the previous selected clock signal R:

$$\text{Number}_{\text{of phase-shifted clock signal to be determined as clock signal } R} = (\text{Number}_{\text{of phase-shifted clock signal previously determined as clock signal } R} + 1) \bmod N.$$

Although in the subsequent step S5, the new clock signal L is determined by the calculation as described for the initially performed step S5 above, the determination of the new clock signal L upon having performed step S20 may also be expressed by basing on the previous selected clock signal L:

$$\text{Number}_{\text{of phase-shifted clock signal to be determined as clock signal } L} = (\text{Number}_{\text{of phase-shifted clock signal previously determined as clock signal } L} + 1) \bmod N.$$

If it is, however, determined in step S19 that the left counter value LC is not greater than the right counter value RC, it is proceeded with step S21. As the case of the counter values being equal is not possible at this stage, it is to be followed that the right counter value RC is greater than the left counter value LC. This result indicates that the actual selected clock signal M statistically samples the data bit at the right side of the bit/eye. Hence, the center sampling of the data bit should be moved towards the left side. This is then accomplished by selecting another one of the phase-shifted clock signals N as clock signal M in step S21. In detail, the next selected clock signal M (new clock signal M) is the one of the phase-shifted clock signals N that has a negative phase-shift of $-2\pi/N$. In other words, new clock signal M is determined by decreasing the number of the phase-shifted clock signal previously selected as the clock signal M by a predetermined amount (may also be more than 1, however must be equal to the predetermined amount as used for possibly incrementing the number of the phase-shifted clock signal to be determined for finding new clock signal M in step S20). Exemplarily, the new clock signal M may be determined by:

$$\text{Number}_{\text{of phase-shifted clock signal to be determined as new clock signal } M} = (\text{Number}_{\text{of phase-shifted clock signal previously determined as clock signal } M} + N - 1) \bmod N.$$

If for instance considering the aforementioned example, wherein phase-shifted clock signal 4 was initially selected as clock signal M, the new clock signal M would be phase-shifted clock signal 3 after performing step S21. After having selected new clock signal M in step S21, it is proceeded with step S4 again and the assessment as to whether the new selected clock signal M represents the "middle strobe" that samples a bit of the data stream at the center of the eye opening is started again. Accordingly, the aforementioned steps are repeatedly performed. For exemplary purposes, it should be mentioned that after decreasing the number of the phase-shifted clock signal to be the new clock signal M, also the clock signals R and L are adjusted according to the above mentioned algorithm.

Although in the subsequent step S4, the new clock signal R is determined by the calculation as described for the initially performed step S4 above, the determination of the new clock signal R upon having performed step S21 may also be expressed by basing on the previous selected clock signal R:

$$\text{Number}_{of\ phase\text{-}shifted\ clock\ signal\ to\ be\ determined\ as\ clock\ signal\ R} = (\text{Number}_{of\ phase\text{-}shifted\ clock\ signal\ previously\ determined\ as\ clock\ signal\ R} + N - 1) \bmod N.$$

Although in the subsequent step S5, the new clock signal L is determined by the calculation as described for the initially performed step S5 above, the determination of the new clock signal L upon having performed step S21 may also be expressed by basing on the previous selected clock signal L:

$$\text{Number}_{of\ phase\text{-}shifted\ clock\ signal\ to\ be\ determined\ as\ clock\ signal\ L} = (\text{Number}_{of\ phase\text{-}shifted\ clock\ signal\ previously\ determined\ as\ clock\ signal\ L} + N + 1) \bmod N.$$

Figure 3:
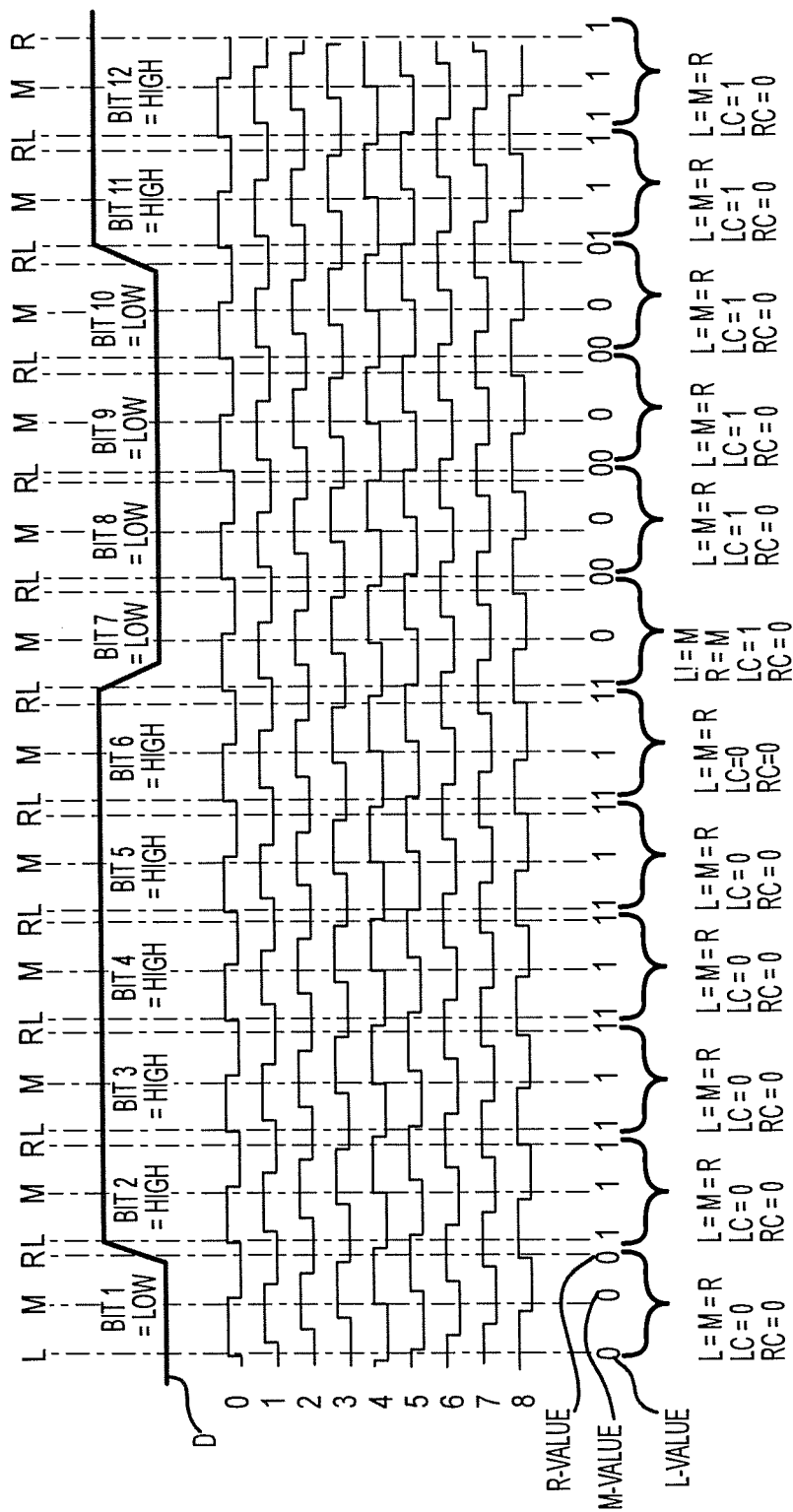
FIG. 3 illustrates a bit sequence of the received data stream and the result of sampling same using predetermined phase-shifted signals according to an embodiment of the invention.

Generally speaking, it should be mentioned that in the method steps S4 to S18, it may be verified as to whether the selected clock signal M already strobes a bit of the data stream at the center, thereby allowing a correct detection of the data, according to an embodiment of the invention. If not, the method steps S19, S20 or S21 and S4 to S18 may then repeatedly be performed until one of the phase-shifted clock signals is found (by repeatedly selecting another phase-shifted clock signal as clock signal M) that strobes a bit of the data stream at the center position, according to another embodiment of the invention. FIG. 3 illustrates a bit sequence of the received data stream and the result of sampling same using predetermined phase-shifted signals according to an embodiment of the invention.

According to this embodiment of the invention, a bit sequence D of 12 bits is shown in FIG. 3. The exemplary diagram also shows 9 phase-shifted clock signals. In this example, phase-shifted clock signal 4 is initially selected as clock signal M. It should be noted that the example relates to the use of the rising edges of the respective phase-shifted clock signals. As already mentioned above, alternatively the falling edges of the respective phase-shifted clock signals may be used.

As can be derived from the figure, the rising edges of phase-shifted clock signal 4 are thus aligned with the vertical dotted line, referenced with "M". "M" is also referred to as "middle strobe", which is the trigger point for sampling the data bits with clock signal M. The sampling values taken at the rising edges of clock signal M are shown underneath the respective dotted line "M" and references with "m-value".

With respect to the example already described for FIGS. 1 and 2, according to which the clock signal M is the phase-shifted clock signal 4, the calculated clock signal R is the phase-shifted clock signal 8. The rising edges of the phase-shifted clock signal 8 are thus aligned with the vertical dotted line, referenced with "R". "R" is also referred to as "right strobe", which is the trigger point for sampling the data bits with the clock signal R. The sampling values taken at the rising edges of the clock signal R are shown underneath the respective dotted line "R" and references with "r-value".

Accordingly, in the example already described for FIGS. 1 and 2, the calculated clock signal L is the phase-shifted clock signal 0. The rising edges of the phase-shifted clock signal 0 are thus aligned with the vertical dotted line, referenced with "L". "L" is also referred to as "left strobe", which is the trigger point for sampling the data bits with the clock signal L. The sampling values taken at the rising edges of the clock signal L are shown underneath the respective dotted line "L" and references with "l-value".

Further, for each data bit a comparison result is shown at the bottom of the figure, after comparing the respective l-, m-, and r-values taken at the respective "trigger points" L, M and R. Referring to e.g. "Bit 1", the l-value is 0 due to the signal being "LOW" at the sampling point "L". Also, the m-value and r-value are 0 due to the signal being "LOW" at the sampling points "M" and "R".

Furthermore, for each sampled bit (3-tuple of values), the counter values RC and LC are provided in the figure.

FIG. 3 shows the sampling and comparison results of the sampled values for a bit sequence of 12 successional bits. As can be seen from the illustration, the rising edge of the clock signal L samples the bit stream at the jittery transition area between the "Bit 6" and "Bit 7". Due to the l-value differing from the m-value, the left counter value LC is increased to 1, while the right counter value RC remains 0. The counter values in this example remain the same until having sampled each data bit three times and after having compared same. Thus, the counter values at the end of the 12 bit sequence indicate that the clock signal M is too far at the left side of the eye opening. Hence, after having performed steps S4 to S18 for each bit of the exemplary bit sequence of 12 bits, the middle strobe is determined as not being in the centre and has to be shifted towards the right side of the eye opening.

Consequently, with reference to step S19, it is determined that new clock signal M is the one of the phase-shifted clock signals whose phase differs from the phase of previously selected clock signal M by 2π/N. In this example, the phase-shifted clock signal 5 is determined as new clock signal M for the next run of the steps S4 to S18 for the next bit sequence of 12 bits. In this example, the calculation at step S4 would indicate the phase-shifted clock signal 0 as new clock signal R. The calculation at step S5 would indicate the phase-shifted clock signal 1 as new clock signal L.

Figure 4:
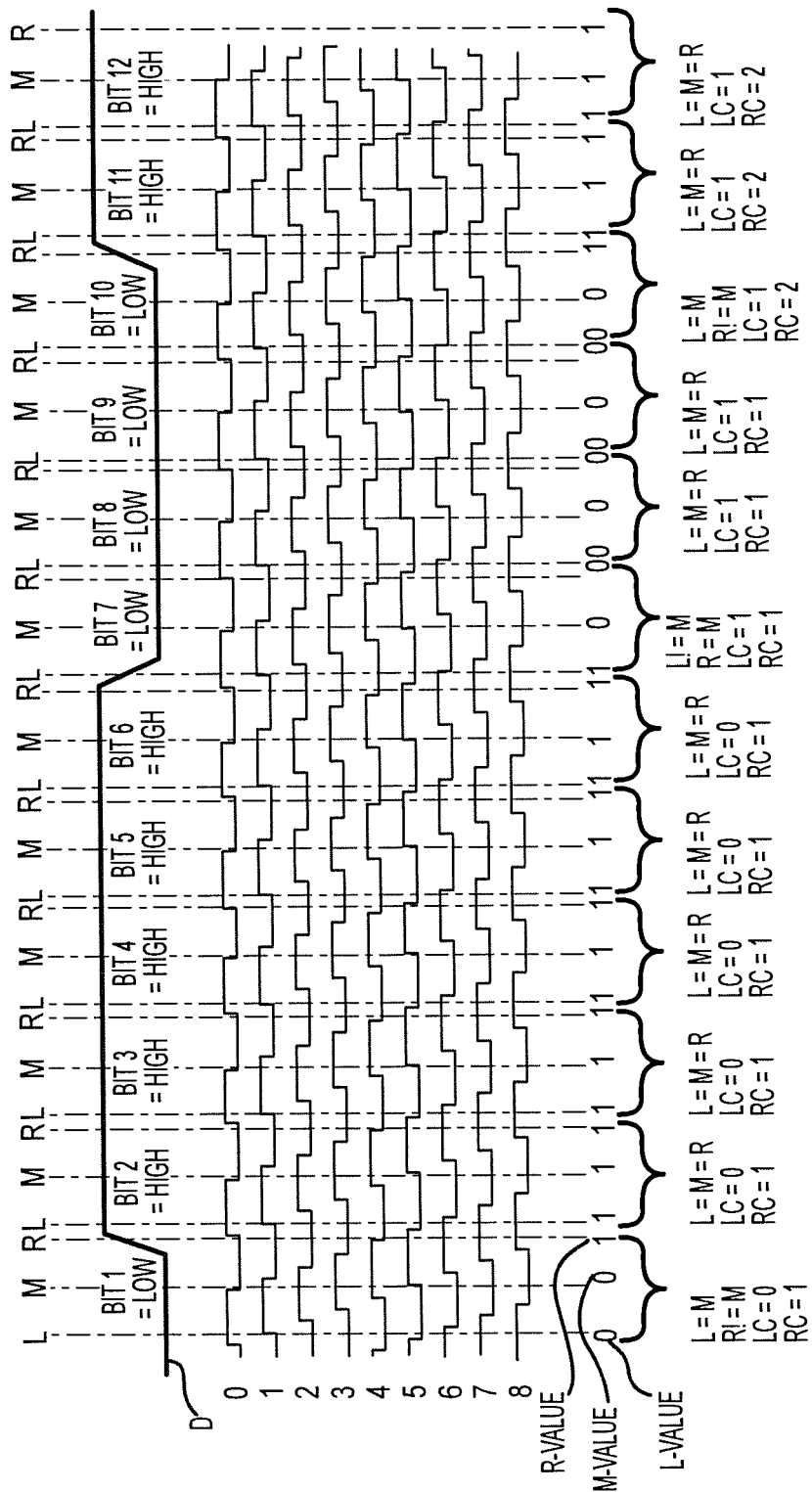
FIG. 4 illustrates a bit sequence of the received data stream and another result of sampling same using predetermined phase-shifted signals according to an embodiment of the invention.

FIG. 4 illustrates a bit sequence of the received data stream and another result of sampling same using predetermined phase-shifted signals according to an embodiment of the invention.

In detail, FIG. 4 shows the sampling and comparison results after having performed the algorithm steps for a further bit sequence of 12 bits based on the results of the previous sampled bit sequence, as illustrated in FIG. 3. In detail, according to FIG. 4, phase-shifted clock signal 5 is clock signal M. The phase-shifted clock signal 0 is the clock signal R. The phase-shifted clock signal 1 is the clock signal L.

As can be seen from the figure, after having sampled all bits, the right counter value RC is higher than the left counter value LC, thereby indicating that the phase-shifted clock signal 5 (which is clock signal M in the figure) does not strobe the data bits at the center. Hence, according to step S21, it is determined to again use phase-shifted clock signal 4 as clock signal M together with the phase-shifted clock signal 8 as clock signal r as well as the phase-shifted clock signal 0 as the clock signal L.

With respect to FIGS. 3 and 4, it is obvious from the exemplary bit sequence and samples as shown in FIG. 3 that clock signal 4 actually strobes the shown data bits at the centre of the eye. However, according to the algorithm, due to the samples taken between the transition from "Bit 6" and "Bit 7", another signal is determined as new clock signal M to be used in the sequence shown in FIG. 4. After having sampled the bit sequence in FIG. 4, again the clock signal M as used in sequence of FIG. 3 is chosen (phase-shifted clock signal 4). It is apparent therefrom that the result after performing the method steps for a predetermined bit sequence indicate, whether the middle strobe is statistically in the center of the eye.

Figure 5:
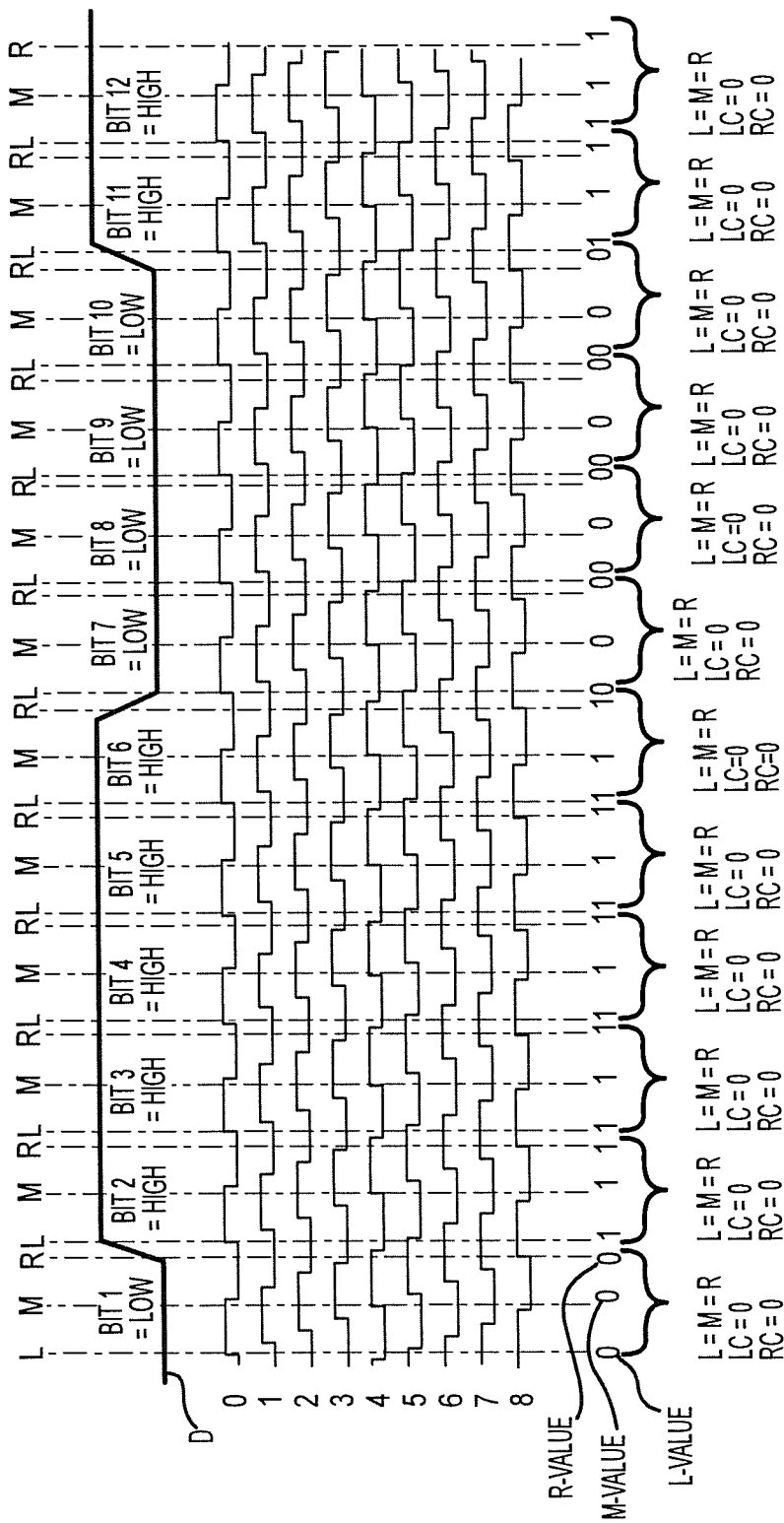
FIG. 5 illustrates a bit sequence of the received data stream and another result of sampling same using predetermined phase-shifted signals according to an embodiment of the invention.

FIG. 5 illustrates a bit sequence of the received data stream and another result of sampling same using predetermined phase-shifted signals according to an embodiment of the invention.

This figure shows a modified data pattern compared to FIGS. 3 and 4. In the figure, it is assumed that the transition between "Bit 6" and "Bit 7" occurs earlier that shown in FIGS. 3 and 4. The exemplarily shown bit transition (which in this example occurs earlier than in the exemplary bit sequence of FIGS. 3 and 4) may for instance happen due to jitter according to a real scenario.

As a result of a first run of the method steps as described for FIG. 2, the comparison result of the counter values RC and LC indicates that the selected clock signal M (phase-shifted clock signal 4 in the example) samples the data bits in the middle so that no correction of the middle strobe is required.

Figure 6:
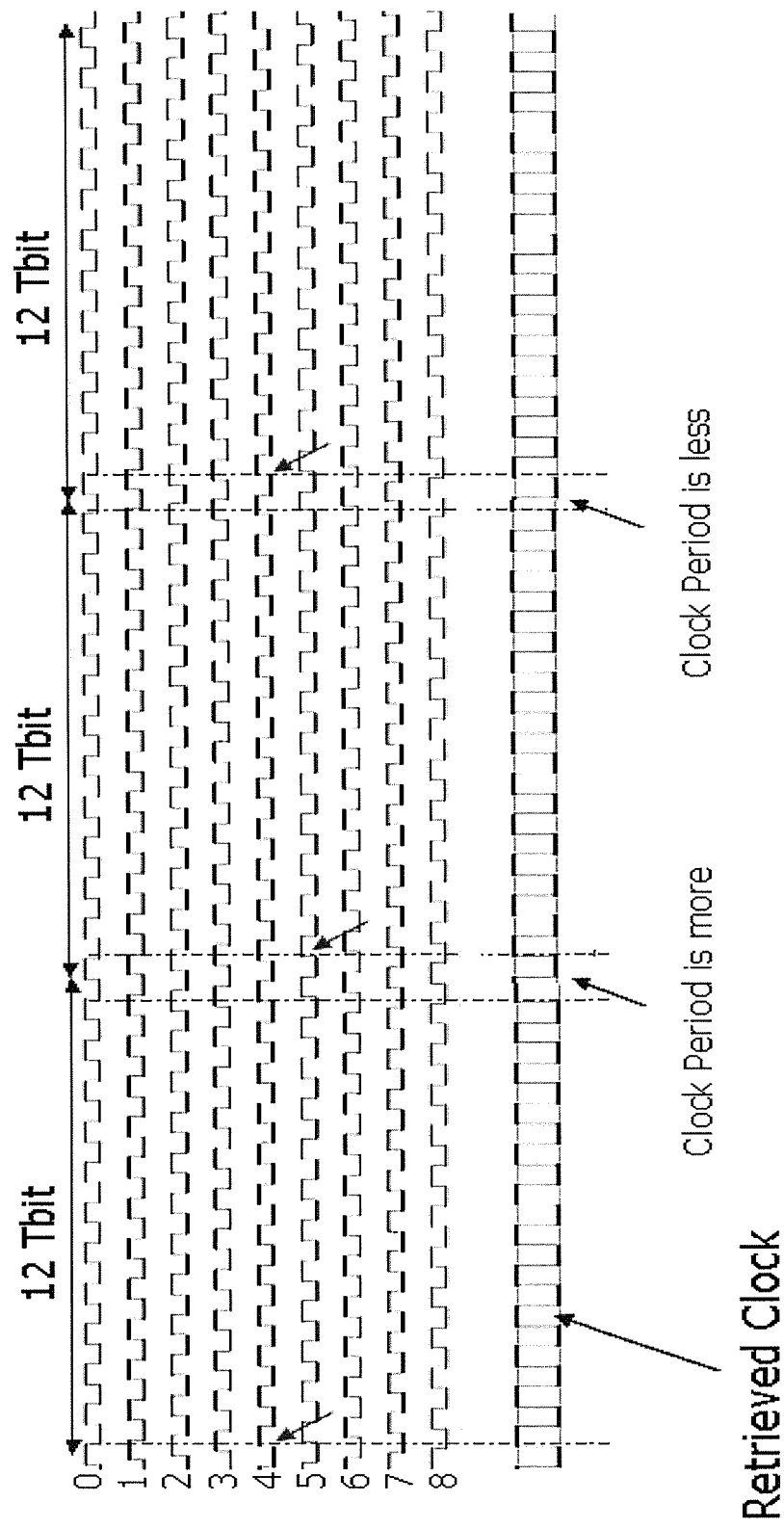
FIG. 6 illustrates the retrieved clock of the input data stream after having sampled plural bit sequences according to an embodiment of the invention.

FIG. 6 illustrates the retrieved clock of the input data stream after having sampled plural bit sequences according to an embodiment of the invention.

The figure shows three exemplary 12 bit sequences (each bit sequence may for instance be 12 Tbit according to another embodiment of the invention), wherein after each bit sequence, another one of the phase-shifted clock signals is chosen as clock signal M. The chosen clock signal M for the respective bit sequence of data stream is indicated by the arrows.

Furthermore, the retrieved clock signal is shown in the figure, which is now capable of strobing the data bits in the centre of the eye.

As can further be seen from the illustration, the clock period of the retrieved clock varies during shifting to another clock signal M. In detail, when the clock signal M changes from the phase-shifted clock signal 4 to 5 (after 12 bits), a single clock period of the retrieved clock signal is more (longer) than the rest of the clock periods. Accordingly, when the clock signal M changes from the phase-shifted clock signal 5 to 4 (after 12 bits), a single clock period of the retrieved clock signal is less (shorter) than the rest of the clock periods.

However, the average clock period of the receiver clock will remain the same.

Figure 7:
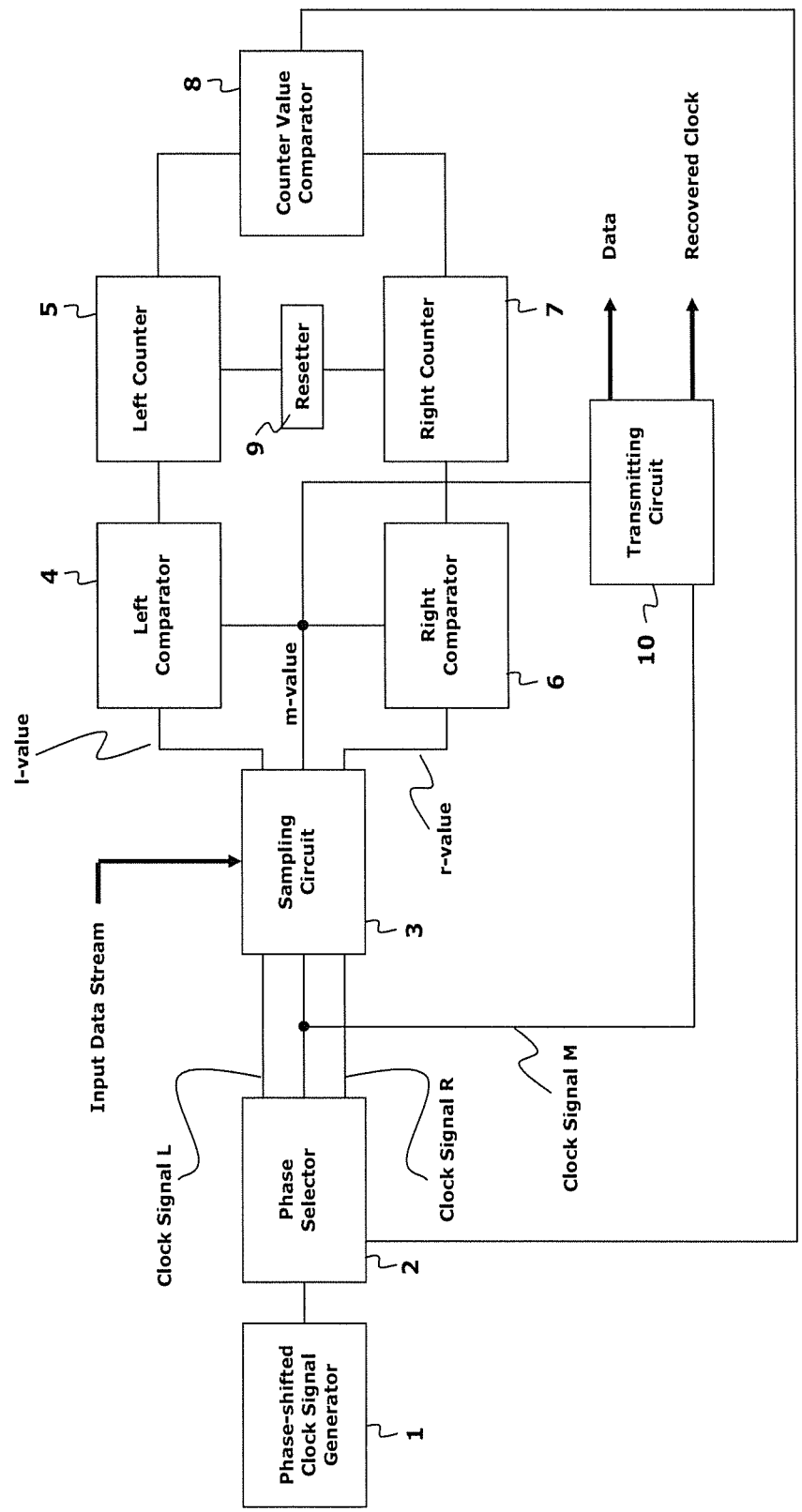
FIG. 7 is a block diagram illustrating the configuration of an apparatus for recovery of a clock from a received digital data stream according to an embodiment of the invention.

FIG. 7 is a block diagram illustrating the configuration of an apparatus for recovery of a clock from a received digital data stream according to an embodiment of the invention. The hardware block diagram in this figure provides the means for carrying out the steps as illustrated in FIG. 2. Although not shown in the illustration of FIG. 7, the apparatus also comprises a processor that controls the entire clock recovery process according to the methods that are shown in FIG. 2.

The apparatus further comprises a phase-shifted clock signal generator 1, which is capable of generating N different phase-shifted clock signals, wherein the phase of each clock signal is consecutively increased by $2\pi/N$ on the basis of the phase of the preceding clock signal. These N phase-shifted clock signals are then provided to a phase selector 2, which determines a clock signal M, a clock signal R and a clock signal L and provides same to a sampling circuit 3. The phase selector also provides the clock signal M to a transmitting circuit 10. The sampling circuit 3 further receives an input data stream and is also capable of selecting a rising/falling edge of the received clock signal M. The sampling circuit 3 also selects in the clock signal R a rising/falling edge, which is nearest in the positive time direction to the selected rising/falling edge of the clock signal M. Even more, the sampling circuit 3 selects in the clock signal L a rising/falling edge that is nearest in the negative time direction to the selected rising/falling edge of the clock signal M. Subsequently the sampling circuit 3 determines an l-value, an m-value and an r-value by sampling the received digital data stream at the selected rising/falling edges of the clock signals L, M and R, respectively.

The apparatus further comprises a left comparator 4, which receives the determined l-value from the sampling circuit 3 as well as the determined m-value. The left comparator 4 then determines whether the l-value differs from the m-value. If so, a left counter 5 increases a counter value LC by a predetermined amount and provides same to a counter value comparator 8.

The sampling circuit 3 further provides the determined r-value as well as the determined m-value to a right comparator 6, which determines whether the r-value differs from the m-value. If so, a right counter 7 increases a counter value RC by the predetermined amount and provides the counter value RC to the counter value comparator 8. The counter value comparator 8 is capable of determining whether the counter value LC is greater than the counter value RC. If so, the counter value comparator 8 provides a signal to the phase selector 2 to select one of the N phase-shifted clock signals which has a phase that differs from the phase of the clock signal M by $2\pi/N$ and to define same as new clock signal M.

The counter value comparator 8 also is capable of determining whether the counter value RC is greater than the counter value LC. If so, the counter value comparator 8 provides a signal to the phase selector 2, which thereafter selects one of the N phase-shifted clock signals, which has a phase that differs from the phase of the clock signal M by $-2\pi/N$ and to define same as new clock signal M.

The sampling circuit 3 further provides the m-value to the transmitting circuit 10. The transmitting circuit 10 is further capable of transmitting the m-value, which represents the recovered data, as well as the clock signal M, which represents the recovered clock, to a digital system.

The apparatus further comprises a resetter 9 which is capable of resetting the counter value RC of the right counter 7 as well as the counter value LC from the left counter 5. For instance, the counter values LC and RC may be "0" after resetting.

Figure 8:
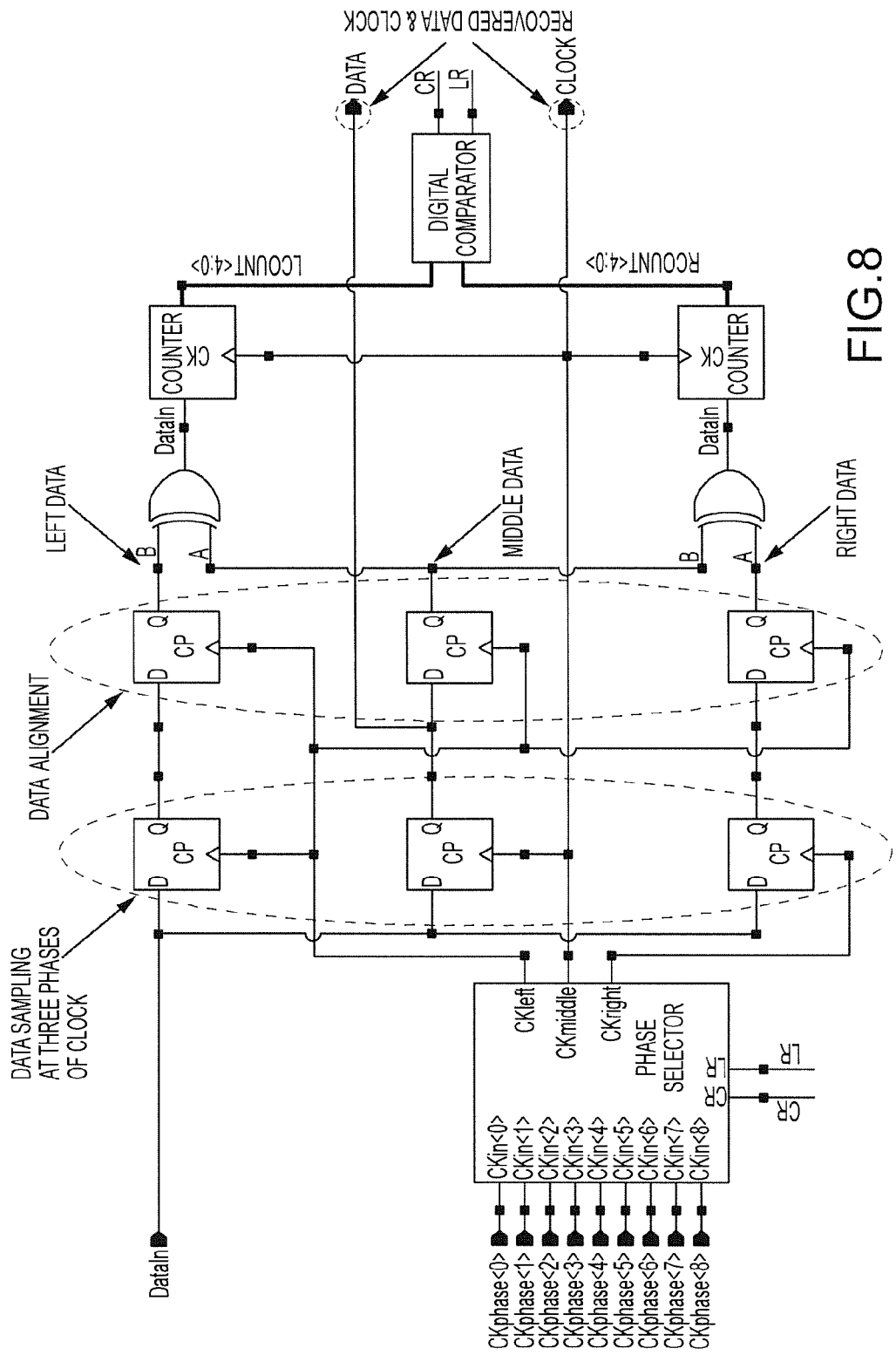
FIG. 8 shows an ICFB Cadence Schematic Layout Editor snapshot of a schematic configuration of the apparatus for recovery of a clock from a received digital data stream according to an embodiment of the invention.

FIG. 8 shows an ICFB Cadence Schematic Layout Editor snapshot of a schematic configuration of the apparatus for recovery of a clock from a received digital data stream according to an embodiment of the invention.

As can be obtained from the exemplary illustration in FIG. 8 of an apparatus for clock recovery, the phase selector 2 is provided with nine different phase-shifted clock signals (<0> to <8>). Furthermore, a data sampling stage as well as a data alignment stage is illustrated by the dotted lines, each comprised of three D-flip-flops. The data sampling stage and the data alignment stage relate to the sampling circuit 3 as shown in FIG. 7. It is further shown in FIG. 8 that the phase selector outputs a clock signal L, referred to as CKleft, clock signal M, referred to as CKmiddle, and clock signal R, referred to as CKright, to the data sampling and data alignment stages.

It is to be noted that the D-flip-flops at the data sampling stage and the data alignment stage are triggered by the rising or falling edges of the respective clock signals, wherein the trigger pulse/clock signal input is provided at the input "CP" of the flip flops.

The data sampling stage receives the three different phase-shifted clock signals and thus is capable of sampling the input data stream at three different points in time triggered by the three different phase-shifted clock signals. The data sampling stage thereby takes the l-value, the m-value and the r-value, referred to as left data, middle data and right data, respectively, in FIG. 8.

The data alignment stage is used to simultaneously provide the three taken values (left data, middle data and right data) to the left and right comparators, which are realised as XOR gates as illustrated in FIG. 8. The output results of the XOR gates are then provided to two counters, which are triggered by the clock signal M, referred to as signal CKmiddle in FIG. 8. According to the exemplary illustration of FIG. 8, the two counters (relating to the left counter 5 and the right counter 7 of FIG. 7) are 5 bit binary counters which are able to count from 0 to 31.

The count result of the two counters shown in FIG. 8 are then provided to a digital comparator (relating to the counter value comparator 8 of FIG. 7), which is capable of instructing the phase selector to determine other phase-shifted clock signals as CKleft, CKmiddle and CKright signals based on the comparison result.

TABLE 1

| Condition | CR | LR |
|---|---|---|
| LCOUNT<4:0> = RCOUNT<4:0> | 0 | X |
| LCOUNT<4:0> > RCOUNT<4:0> | 0-1-0 (Single Pulse) | 1 |
| LCOUNT<4:0> < RCOUNT<4:0> | 0-1-0 (Single Pulse) | 0 |

In Table 1, a truth table of the output of the digital comparator of FIG. 8 is shown. According to this table, in case of the counter value of the left counter (LCOUNT) being equal to the counter value of the right counter (RCOUNT), the output signal CR (which stands for "Change Request") indicates that the clock signals CKleft, CKmiddle and CKright do not have to be changed. In this exemplary case, no signal LR (which stands for "Left or Right Shift") is output due to no phase shifts of the clock signals need to be carried out.

Table 1 further shows that in case of the left counter value (LCOUNT) being greater than the right counter value (RCOUNT), the output signal CR may be a single pulse so as to indicate the change of the phase-shifted signals. In this exemplary case, the output signal LR may be "1", thereby indicating to the phase selector to select a new clock signal M whose phase differs from the previous clock signal M by $2\pi/N$ ($2\pi/9$ according to the example).

Table 1 also shows that in case of the left counter value being less than the right counter value, the output signal CR may also be a signal pulse so as to the change of the phase-shifted signals. The output signal LR may be "0", thereby indicating to the phase selector to select a new clock signal M whose phase differs from the previous clock signal M by $-2\pi/N$ ($-2\pi/9$ according to the example).

The output signals CR and LR may then be provided to the phase selector. It is also shown in FIG. 8 that the clock signal M, referred to as CKmiddle in FIG. 8, is output as the recovered clock and that the taken m-value, referred to as middle data, is output as recovered data.

Figure 9:
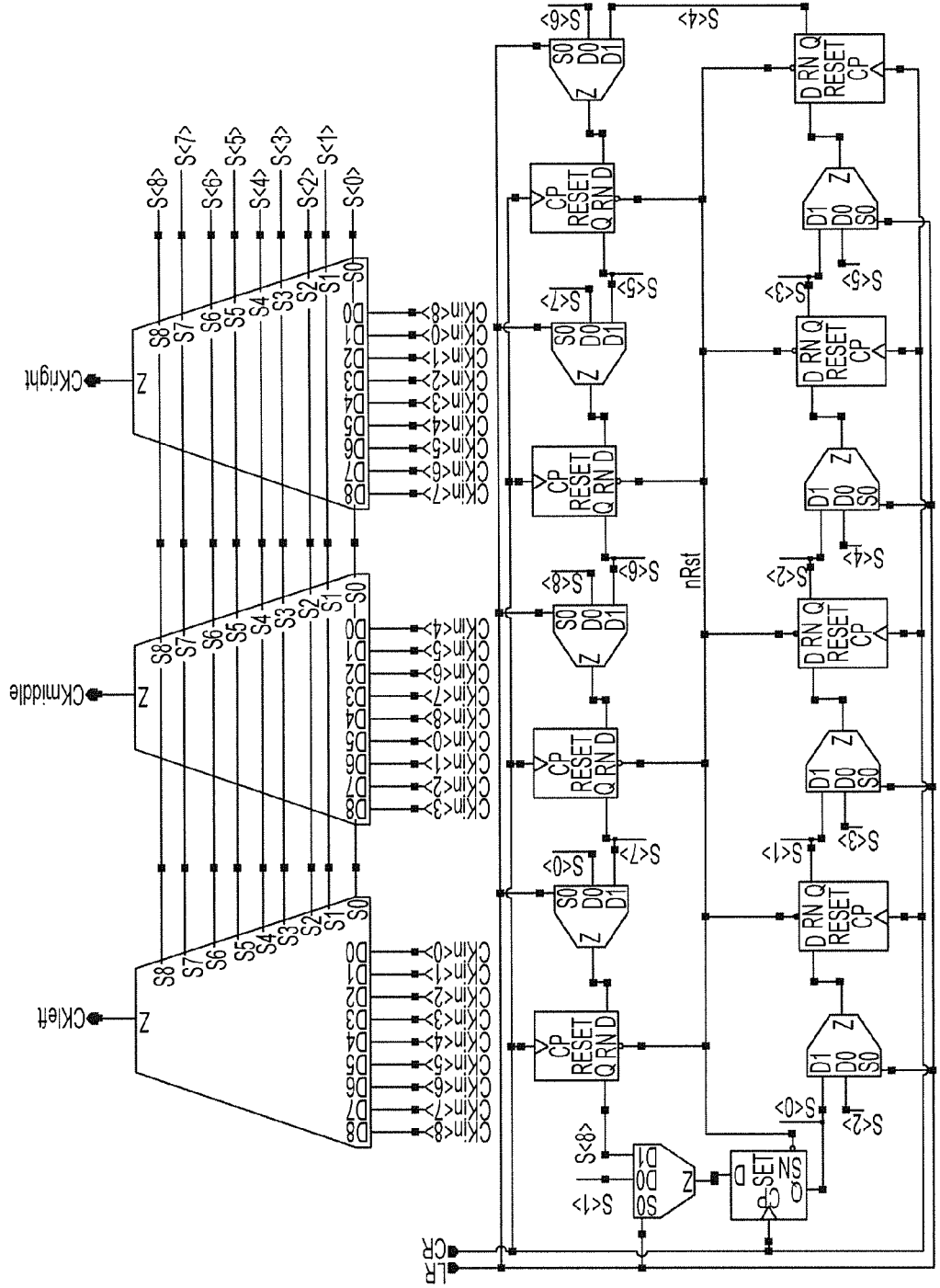
FIG. 9 shows an ICFB Cadence Schematic Layout Editor snapshot of a detailed schematic configuration of a phase selector of the apparatus for recovery of a clock from a received digital data stream according to an embodiment of the invention.

FIG. 9 shows an ICFB Cadence Schematic Layout Editor snapshot of a detailed schematic configuration of a phase selector of the apparatus for recovery of a clock from a received digital data stream as shown in FIG. 8, according to an embodiment of the invention. The labelling/numerals of the illustration in FIG. 9 is in line with same already used for the description of FIG. 8.

Although the figures relate to a case, wherein the frequency of the data stream is equal to the frequency of the phase-shifted clock signals, it is apparent from the foregoing description that the clock of the receiver may also be retrieved in an efficient and fast way in case of the frequency of the input data stream varying due to high jitter, high frequency drift, or the like.

As could be demonstrated above, after processing a plurality of bit sequences (which can have a predetermined bit length) which may lead to a stepwise approach of the selected clock signal M to the correct clock signal M, the data sampling can be carried out with a correct retrieved clock. Consequently, even in case of having high frequency drift and/or high jitter, the recovered clock's average frequency will be the same as the transmitter's clock inherent in the received data stream so that the data bits can reliably be detected at the center of each data bit.

It is further apparent from the description of the method according to the plurality of embodiments of the invention that the problems known in the prior art are solved such as the invention provides a high frequency drift and high jitter tolerant method and apparatus for recovering the clock of a received data stream.

Furthermore, the method according to the plurality of embodiments of the invention denotes an area and power efficient methodology for clock data recovery. In particular, due to on average each data bit of the received data stream only needs to be strobed at three times, there is a significant gain in the required area for implementing circuits performing the above described method. Due to approximately one data bit need to merely be sampled at three sampling points, the load on pre-amplifiers is low, which guarantees a further reduction of the circuit area.

Even more, the required circuit area may be further reduced due to no elasticity buffer being needed in case of frequency drift as the method allows for a quick adaptation and clock recovery in case of frequency drift and/or jitter.

Also, the method according to the various embodiments allows for a reduction of the lock time compared to the methods and circuits known in the prior art.

The invention can further be detected in a final product, if clock data recovery is high frequency drift and high jitter tolerant. The invention can further be detected in the final product by reverse engineering of the circuit.

While the invention has been described with respect to preferred physical embodiments constructed in accordance therewith, it will be apparent to those skilled in the art that various modifications, variations and improvements of the present invention may be made in the light of the above teaching and within the preview of the appended claims without departing from the spirit of the intended scope of the invention. In addition, those areas in which it is believed that those of ordinary skill in the art are familiar have not been described herein in order to avoid unnecessarily obscuring the invention described herein. Accordingly, it is to be understood that the invention is not be limited to the specific illustrative embodiments, but only by the scope of the appended claims.

The invention claimed is:

1. A method for recovery of a clock from a received digital data stream, the method comprising:
   a) generating N phase-shifted dock signals;
   b) determining one of the N phase-shifted clock signals as a clock signal M;
   c) determining another one of the N phase-shifted dock signals as a clock signal R, wherein the phase of the clock signal R differs from the phase of the clock signal M by a first predetermined phase-shift;
   d) determining another one of the N phase-shifted clock signals as a clock signal L, wherein the phase of the clock signal L differs from the phase of the clock signal M by a second predetermined phase-shift;
   e) selecting a rising/falling edge of the clock signal M;
   f) selecting in the clock signal R a rising/falling edge that is nearest in the positive time direction to the selected rising/falling edge of the clock signal M;
   g) selecting in the clock signal L a rising/falling edge that is nearest in the negative time direction to the selected rising/falling edge of the clock signal M;
   h) determining an I-value, an m-value and an r-value by respectively sampling the received digital data stream at the selected rising/falling edges of the clock signals L, M, and R;
   i) increasing a counter value LC by a predetermined amount, if the I-value differs from the m-value;
   j) increasing a counter value RC by the predetermined amount, if the r-value differs from the m-value;
   k) selecting one of the N phase-shifted clock signals which has a phase that differs from the phase of the clock signal M and defining the selected signal as the clock signal M if the counter value LC is greater than the counter value RC; and
   l) selecting one of the N phase-shifted clock signals which has a phase that differs from the phase of the dock signal M and defining the selected signal as the dock signal M if the counter value RC is greater than the counter value LC wherein N is an integer; M, L, and R respectively denote middle, left, and right; m-value, I-value, and r-value are digital values; LC and RC are counter values; and wherein the method is practiced by a clock recovery circuit.

2. The method according to claim 1, further comprising the step of resetting the counter value LC and the counter value RC to an initial value after having performed step g).

3. The method according to claim 1, wherein the digital data stream comprises plural bits each at a bit period.

4. The method according to claim 3, wherein a cycle duration of the N phase-shifted clock signals is substantially equal to the bit period of the received digital data stream.

5. The method according to claim 1, wherein steps h) to j) are repeatedly performed.

6. The method according to claim 1, wherein after having initially performed the steps a) to l), steps b) to l) are repeatedly performed until the counter value RC is equal to the counter value LC.

7. The method according to claim 1, wherein the selected clock signal M relates to the recovered clock, if the counter value RC is equal to the counter value LC.

8. The method according to claim 1, wherein the first predetermined phase-shift is defined as the maximum forward phase-shift between a rising/falling edge of one of the N phase-shifted dock signals and a rising/falling edge of the clock signal M within a relative forward phase-shift range less than π.

9. The method according to claim 1, wherein the second predetermined phase-shift is defined as the maximum backwards phase-shift between a rising/falling edge of one of the N phase-shifted clock signals and a rising/falling edge of the dock signal M within a relative backwards phase-shift range less than π.

10. The method according to claim 1, wherein the predetermined amount for increasing the counter value RC and/or the counter value LC is 1.

11. The method according to claim 1, further comprising the step of transmitting, to a digital system, the determined m-value and the determined clock signal M after having performed step h).

12. The method according to claim 1, further comprising the steps of maintaining the determined dock signal M and performing steps c) to l), if the counter value RC is equal to the counter value LC.

13. The method according to claim 1, wherein steps c) to l) are performed after having performed step k) or l).

14. The method according to claim 1, wherein N is an odd number.

15. An apparatus for recovery of a clock from a received digital data stream, the apparatus comprising:
    a phase-shifted dock signal generator configured to generate N phase-shifted clock signals;
    a phase selector configured to:
       determine one of the N phase-shifted dock signals as a dock signal M;
       determine another one of the N phase-shifted clock signals as a clock signal R, wherein the phase of the clock signal R differs from the phase of the clock signal M by a first predetermined phase-shift; and
       determine another one of the N phase-shifted dock signals as a clock signal L, wherein the phase of the clock signal L differs from the phase of the clock signal M by a second predetermined phase-shift;
    a sampling circuit configured to:
       select a rising/falling edge of the clock signal M;
       select in the clock signal R a rising/falling edge that is nearest in the positive time direction to the selected rising/falling edge of the clock signal M;
       select in the clock signal L a rising/falling edge that is nearest in the negative time direction to the selected rising/falling edge of the clock signal M; and
       determine an l-value, an m-value and an r-value by respectively sampling the received digital data stream at the selected rising/falling edges of the clock signals L, M, and R;
    a left counter configured to increase a counter value LC by a predetermined amount, if it has been determined by a left comparator that the I-value differs from the m-value; and
    a right counter configured to increase a counter value RC by the predetermined amount, if it has been determined by a right comparator that the r-value differs from the m-value;
    wherein the phase selector is further configured to:
       select one of the N phase-shifted dock signals which has a phase that differs from the phase of the dock signal M and defining the selected signal as the dock signal M, if a counter value comparator has determined that the counter value LC wherein N is an integer; M, L, and R respectively denote middle, left, and right; m-value, I-value, and r-value are digital values; and", LC and RC are counter values is greater than the counter value RC; and to select one of the N phase-shifted clock signals which has a phase that differs from the phase of the clock signal M and defining the selected signal as the clock signal M, if the counter value comparator has determined that the counter value RC is greater than the counter value LC.

16. The apparatus according to claim 15, wherein the digital data stream comprises plural bits each at a bit period.

17. The apparatus according to claim 16, wherein the cycle duration of the N phase-shifted clock signals is substantially equal to the bit period of the received digital data stream.

18. The apparatus according to claim 15, wherein the selected clock signal M relates to the recovered clock, if the counter value comparator has determined that the counter value RC is equal to the counter value LC.

19. The apparatus according to claim 15, wherein the first predetermined phase-shift is defined as the maximum forward phase-shift between a rising/falling edge of one of the N phase-shifted clock signals and a rising/falling edge of the dock signal M within a relative forward phase-shift range less than $\pi$.

20. The apparatus according to claim 15, wherein the second predetermined phase-shift is defined as the maximum backwards phase-shift between a rising/falling edge of one of the N phase-shifted clock signals and a rising/falling edge of the clock signal M within a relative backwards phase-shift range less than $\pi$.

21. The apparatus according to claim 15, further comprising a transmitting circuit for transmitting, to a digital system, the determined m-value and the determined clock signal M.

22. The apparatus according to claim 15, wherein N is an odd number.

* * * * *

UNITED STATES PATENT AND TRADEMARK OFFICE
CERTIFICATE OF CORRECTION

PATENT NO. : 8,681,918 B2  
APPLICATION NO. : 13/784571  
DATED : March 25, 2014  
INVENTOR(S) : Nitin Gupta Page 1 of 1

It is certified that error appears in the above-identified patent and that said Letters Patent is hereby corrected as shown below:

On the Title Page

Item (57) Abstract

Line 1, "dock" should be --clock--

Line 3, "dock" should be --clock--

Line 4, "dock" should be --clock--

In the Claims

Column 19, line 4, "dock" should be --clock--

Column 19, line 7, "dock" should be --clock--

Column 19, line 36, "dock" should be --clock--

Column 19, line 37, "dock" should be --clock--

Column 19, line 64, "dock" should be --clock--

Column 20, line 5, "dock" should be --clock--

Column 20, line 15, "dock" should be --clock--

Column 20, line 24, "dock" should be --clock--

Column 20, line 27, "dock" should be --clock--

Column 20, line 28, "dock" should be --clock--

Column 20, line 33, "dock" should be --clock--

Column 20, line 58, "dock" should be --clock--

Column 20, line 59, "dock" should be --clock--

Column 20, line 60, "dock" should be --clock--

Column 21, line 19, "dock" should be --clock--

Signed and Sealed this  
Twenty-fourth Day of June, 2014

Michelle K. Lee  
*Deputy Director of the United States Patent and Trademark Office*